United States Patent [19]

Currie

[11] Patent Number: 5,162,974
[45] Date of Patent: Nov. 10, 1992

[54] HEAT SINK ASSEMBLY FOR COOLING ELECTRONIC COMPONENTS

[75] Inventor: Thomas P. Currie, St. Paul, Minn.

[73] Assignee: Unisys Corporation, Blue Bell, Pa.

[21] Appl. No.: 685,327

[22] Filed: Apr. 15, 1991

[51] Int. Cl.⁵ .............................................. H05K 7/20
[52] U.S. Cl. .................................. 361/385; 165/80.3;
165/185; 174/15.2; 357/79; 357/80; 357/81;
361/382; 361/386
[58] Field of Search .................. 165/80.3, 104.33, 185;
174/15.2; 357/79, 81, 82; 361/381, 382, 385,
386, 389

[56] References Cited

U.S. PATENT DOCUMENTS

| | | | |
|---|---|---|---|
| 2,958,021 | 10/1960 | Cornelison et al. | 174/152 |
| 4,639,829 | 1/1987 | Ostergren et al. | 361/385 |
| 4,908,695 | 3/1990 | Morihara et al. | 361/385 |
| 4,951,740 | 8/1990 | Peterson et al. | 165/104.33 |

OTHER PUBLICATIONS

Meeker et al., "Module Thermal Cap for Semiconductor Chip Package", vol. 20 No. 7 Dec. 1977, pp. 2699–2671.

Primary Examiner—Gregory D. Thompson
Attorney, Agent, or Firm—LeRoy D. Maunu; Charles A. Johnson; Mark T. Starr

[57] ABSTRACT

A heat sink system for cooling electronic components and especially integrated circuits on a printed circuit board is disclosed. A heat sink having a heat pipe and a plurality of fins spaced and positioned perpendicular to the longitudinal axis of the heat pipe is connected at one end to a heat collector. The surface of the heat collector is urged by a spring biasing mechanism into secure thermal contact with a heat spreader connected to the integrated circuit package. The heat collector consists of two sections. One section is connected to one end of the heat pipe and has a hemispherically shaped end. The other section has an associated mating hemispherically shaped socket and is connected to the heat spreader. The two sections form a hemispherical interface serving both to increase the thermal efficiency of the heat sink and to act as a self-positioning mechanism.

14 Claims, 6 Drawing Sheets

HEAT SINK ASSEMBLY FOR COOLING ELECTRONIC COMPONENTS

BACKGROUND OF THE INVENTION

1. Field of the Invention

This invention relates generally to heat sink assemblies used for dissipating heat produced by electronic components. More particularly, it relates to heat sink assemblies utilizing high efficiency heat pipes as the heat transfer device in place of relying on the heat conduction of a metal such as copper. Still more particularly, it relates to an improved air cooled heat sink assembly having a shaped configuration for providing proper alignment and thermal contact between the heat sink and the electronic component, wherein contact is achieved by use of a biasing mechanism. In particular, the invention includes a heat collector with a hemispherically shaped end adapted to mate with a hemispherical socket in a second heat collector mounted on the electronic component for providing alignment and increasing the heat transfer surface area.

2. State of the Prior Art

A significant problem with electronic circuit board components, including integrated circuits, is that they generate substantial heat. Since most of these components are sensitive to excessive heat, it is necessary to provide some means of cooling the components. This problem has increased as technology has been developed allowing the components to be made smaller in size. This means that more components generating the same amount of heat can be packed into a smaller space. It also means that the surface area through which the heat must be dissipated has decreased. Use of various types of heat sinks, including heat pipes, for cooling are well-known. Using heat pipes is significantly more efficient since they are capable of transferring up to one thousand times more energy than a solid copper bar.

The cooling systems presently being used have certain disadvantages. Some of the systems must be manufactured as an integral part of the printed circuit board assembly. As described in U.S. Pat. No. 4,019,098 to McCready et al, there is shown a heat pipe cooling system wherein one heat pipe for each row of integrated circuit packages is contained in a heat transfer structure. The heat transfer structure is secured to the circuit board and the integrated circuit packages are secured to the other side of the heat transfer structure. The disadvantage of this system is that it must be manufactured as a part of the printed circuit board assembly and is not readily separable from the printed circuit board or the components being cooled. Other systems utilize a liquid to cool the electronic components. Still others cool by refrigeration. In both cases these systems are costly and somewhat difficult to maintain. Some heat sinks are rigidly attached to the electronic component by solder or thermally conductive adhesive. These can, because of their weight, add excessive stress to the component and its attachment to its next level of assembly (PC board) especially during shipment or handling. Other heat sink cooling systems depend on placing the heat sink in contact with the electronic component through separable thermally conductive interfaces. The problem with these systems is that their effectiveness is reduced if their interfaces are misaligned or do not make proper contact. It is desirable to maximize the heat transfer across the interface, since the more heat which passes into the heat sink through the interface, the more efficient the heat sink. Uniform contact and proper alignment of the interfaces will maximize thermal conductivity at the interface, and thereby improve the overall efficiency of the heat sink.

SUMMARY OF THE INVENTION

The present invention provides an improved cooling assembly for electronic components and especially integrated circuit packages mounted on a printed circuit board. The assembly includes at least one heat sink. Preferably, the assembly includes a heat sink for each electronic component or integrated circuit package, thereby making effective use of the limited surface area through which heat can be dissipated. Each heat sink preferably includes a heat pipe because of its superior heat transfer efficiency. One end of the heat pipe is connected to a heat collector. The heat collector has an end portion which is placed in thermal contact with a heat spreader on the integrated circuit package. The heat collector is held in good thermal contact with the heat spreader on the integrated circuit package by means of a biasing mechanism. In the preferred embodiment the heat collector has two sections. The first section is connected to the heat pipe and has a hemispherically shaped end. The second section is connected to the heat spreader of the integrated circuit package and has a hemispherically shaped socket which mates with the hemispherically shaped end of said first section. The two sections of the heat collector ar held in good thermal contact with one another by the biasing mechanism. The shape of the hemispherical heat collector automatically assures proper alignment of the heat pipe and will accommodate any height and planarity variations. The shape also provides greater surface area which further increases the thermal efficiency of the interface.

Use of this cooling system in cooperation with a means to cause air flow provides effective dissipation of heat from electronic components without the need for use of liquids or refrigeration.

OBJECTS

It is a primary object of the present invention to provide a new and improved cooling system for electronic components.

Another object of the invention is to provide a new and improved cooling system utilizing one or more high efficiency heat pipes.

An additional object of the invention is to provide an improved cooling system having an improved heat sink interface with the electronic component so that the thermal conductivity across the interface is maximized.

A further object of the invention is to provide a new and improved cooling system having a biasing mechanism to insure good thermal contact with an electronic component to be cooled.

DETAILED DESCRIPTION OF THE INVENTION

Figure 1:
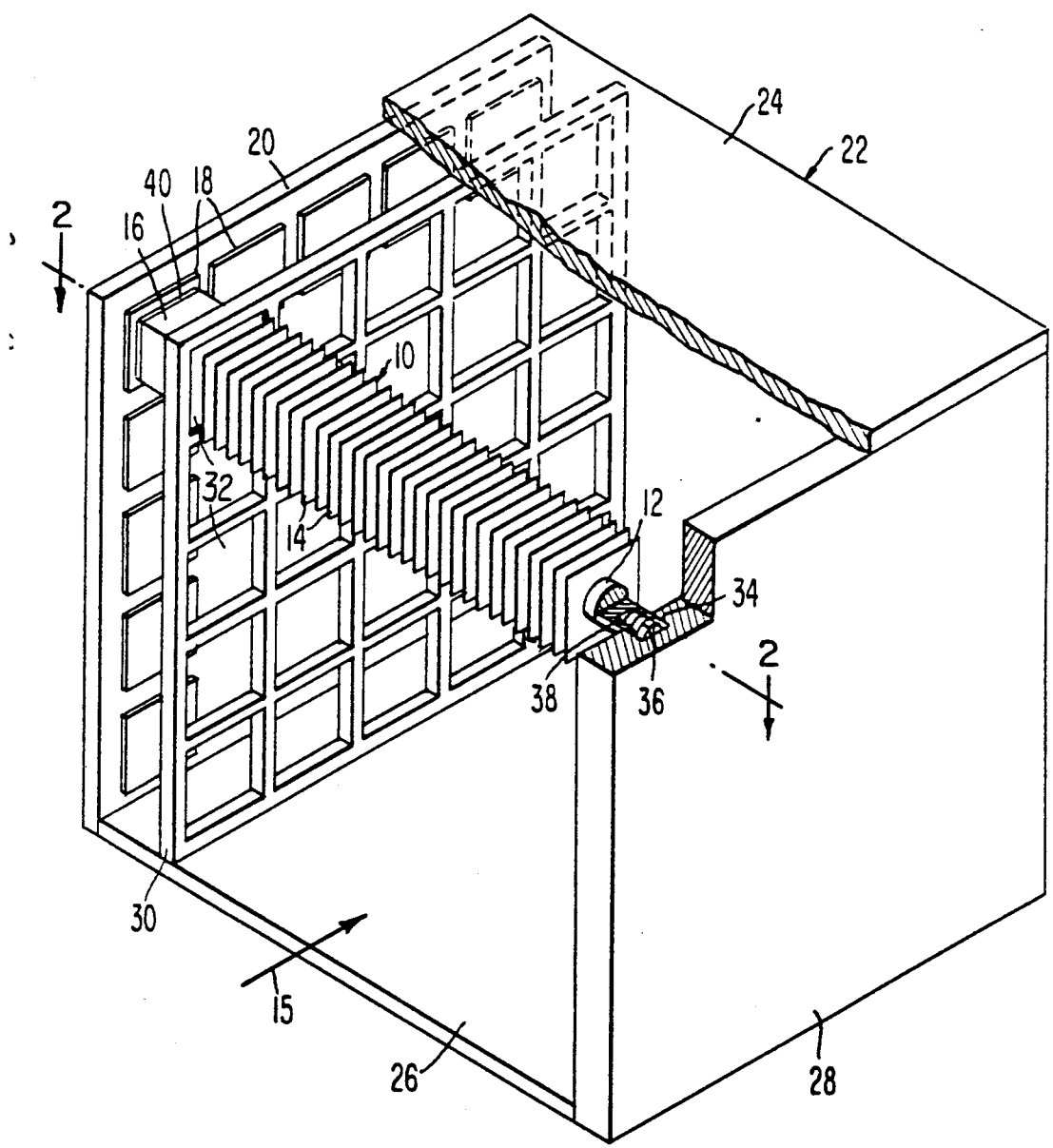
FIG. 1 is a perspective view of the cooling system adapted to utilize a plurality of heat sink assemblies, as it would be mounted in a cooling chamber in conjunction with a printed circuit board having a five-by-five array of integrated circuit packages, with all but one of the heat sinks omitted for purposes of clarity.

FIG. 1 is a perspective view of the cooling assembly adapted to utilize a plurality of heat sink assemblies, as it would be mounted in a cooling chamber in conjunction with a printed circuit board having a five-by-five array of integrated circuit packages, with all but one of the heat sinks omitted for purposes of clarity. Heat sink 10 is comprised of a heat pipe 12 to which is connected a plurality of flat fins 14 which are spaced along heat pipe 12 in planes perpendicular to the longitudinal axis of heat pipe 12. In a preferred embodiment fins 14 are equally spaced and are square but other spacing and shapes can be utilized as necessary to accommodate proper cooling with available air flow. The number and surface area of fins 14 will be selected to dissipate adequate heat into the medium flowing over the fins. The cooling medium can be air moving in the direction of arrow 15. The heat pipe 12 is connected at one end to a heat collector 16. FIG. 1 shows the cooling system as it would be used to cool a five-by-five array of integrated circuit packages 18 mounted on a printed circuit board 20. For purposes of clarity only one of the heat sinks 10 is shown although in practice a separate heat sink 10 would be used for each integrated circuit package 18. It should be noted that although in the embodiment shown heat sink 10 includes heat pipe 12, it would be possible to use other thermally conductive materials in place of heat pipe.

The heat sink 10 is held in proper alignment by the cooling assembly housing 22 which consists of a first support member 24, a second parallel support member 26, an end panel 28 and a front support grid member 30 mounted between first support member 24 and second support member 26. The size of heat collector 16 is smaller than an opening 32 in support grid member 30. Heat collector 16 is positioned inside of opening 32 so that support grid member 30 provides support to heat sink 10 in all directions within the plane of support grid member 30. Fins 14 are larger than openings 32 so that support grid member 30 will keep heat sink 10 from any further movement in the direction of support grid member 30.

The back end of heat pipe 12 extends into a recess 34 in end panel 28 and is spring biased in the direction of support grid member 30 by means of an associated spring 36 which is located in a cavity 38 at the end of heat pipe 10. Spring 36 serves three major functions. First, prior to the time that cooling assembly housing 22 is connected to printed circuit board 20, spring 36 forces its associated heat pipe 10 in the direction of support grid member 30 until the first fin 14 comes into contact with support grid member 30, thereby holding heat sink 10 in proper and secure position. Second, when the cooling assembly housing 22 is connected to the printed circuit board, first support member 24 and second support member 26 are secured to the printed circuit board 20 such that heat collector 16 is properly aligned and butting against a heat spreader 40 on the associated integrated circuit package 18. Heat spreader 40 is constructed from a thermally conductive material and is affixed to the integrated circuit package 18 and serves to spread the heat to a larger area than the originating active area on the integrated circuit package 18. In this position heat sink 10 is pushed back slightly in the direction of its longitudinal axis so that the first fin 14 is no longer contacting support grid member 30. Spring 36 serves to keep a constant pressure on heat sink 10 in the direction of the integrated circuit package 18 thereby assuring proper alignment and thermal contact of heat collector 16 with heat spreader 40. Third, the spring biasing of the spring 36 allows for deviations in the depth dimension of recess 34 and cavity 38 and for deviations in the height of the associated integrated circuit package 18 and its heat spreader 40 from the surface of printed circuit board 20. It is significant to note at this time that when this configuration is applied to multiple integrated printed circuit packages 18 such as the five-by-five array in this example, each heat sink 10 is allowed to individually comply with height and planarity discrepancies so that thermal contact and efficiency can be increased.

Even though heat pipes are well known in the prior art, it would be helpful to point out some of the details regarding the use of heat pipes and how they function. Heat pipes utilize a sealed container, such as a pipe. Internally the pipe has a capillary wick structure and working fluid which is in equilibrium with its own vapor. Heat applied to one end of the external surface of the pipe causes the nearly instantaneous evaporation of the working fluid near that surface. The generation of vapor creates a pressure differential which causes the excess vapor to migrate toward the other end of the pipe. The vapor condenses along the pipe, with the latent heat of evaporation thereby being transferred to the pipe and associated fins. The fluid then returns to the heated end of the pipe via the capillary wick structure. The heat pipe results in an almost uniformly efficient transfer and dissipation of heat along the entire surface of the heat pipe. This means that heat is dissipated to the cooling medium uniformly and efficiently by all of the fins arranged along the axis of the heat pipe, not just those that are located closest to the heat collector 16.

Figure 2:
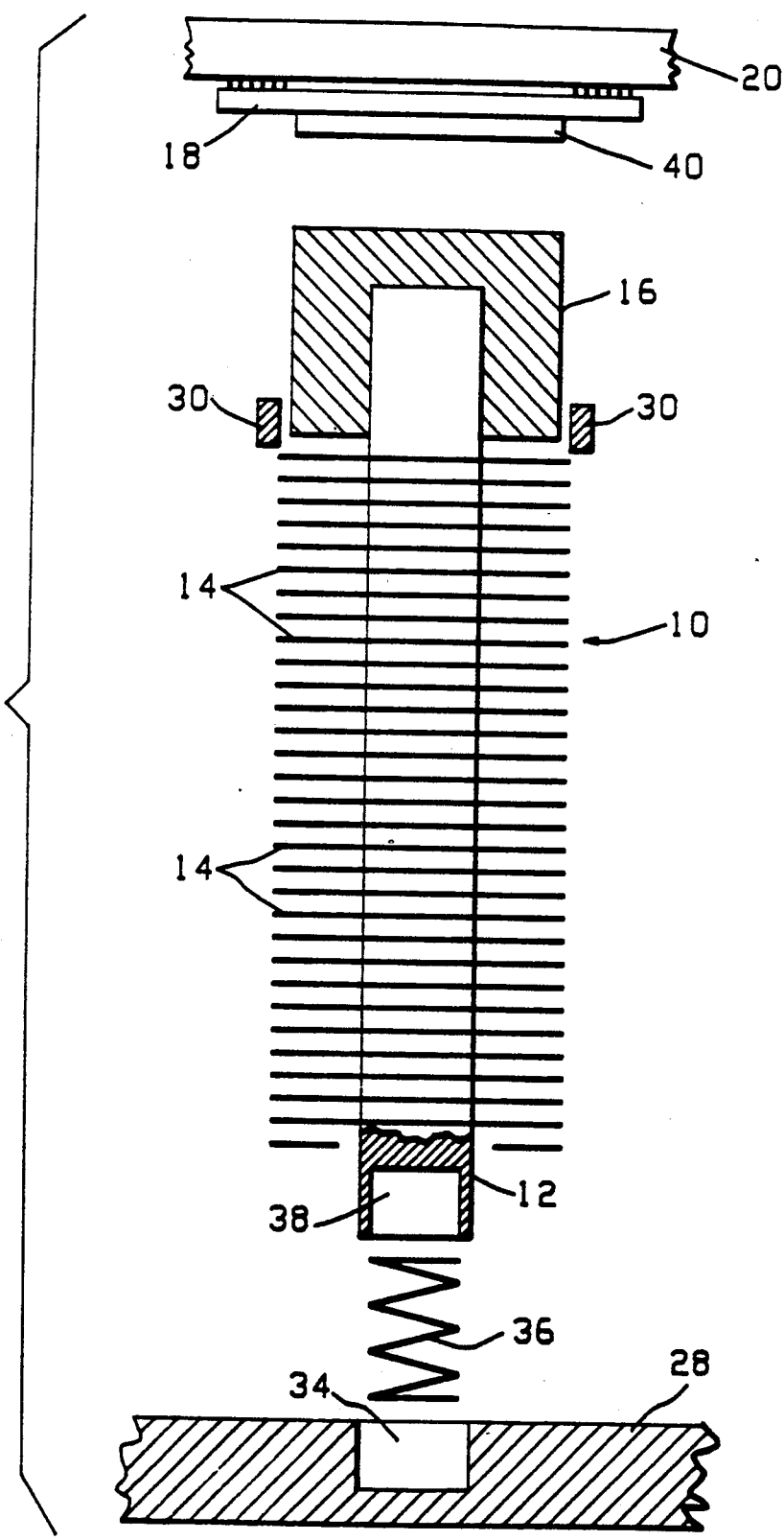
FIG. 2 is a sectional view taken along line 2—2 of FIG. 1, and is exploded to show the interrelationship of the different parts of a heat sink assembly.

FIG. 2 is a sectional view taken along line 2-2 in FIG. 1, and is exploded to show the interrelationship of heat sink 10, end panel 28 and integrated circuit package 18. It can be seen that spring 36 is adapted to fit inside cavity 38 in the end of heat pipe 12. Heat pipe 12 in turns fits within recess 34 in end panel 28. In the assembled position spring 36 maintains a constant pressure on heat sink 10 along its longitudinal axis in the direction of the integrated circuit package 18. This is important since good secure contact between heat collector 16 and heat spreader 40 is necessary for maximum efficiency. In practice a thermal grease or oil is placed on the interface between heat collector 16 and heat spreader 40. Thermal grease or oil is an efficient thermal conduction medium and its use is well known. The thermal grease or oil fills any air gaps between the surfaces of the interface in order to further increase thermal conductivity at the interface.

In operation the heat sink assembly is air cooled by natural convection or, preferably, by fans. Referring to FIG. 1 the fans, which are not shown, would move the air in the direction of the arrow 15. It should be noted that the size of the heat sink assembly including heat pipe 12, fins 14 and heat collector 16 will be dependent upon the size, number, configuration and cooling requirements of the integrated circuit packages 18.

By way of example, for integrated circuit packages 18 rated at 70 watts, with an air flow of 700 cubic feet per minute in the direction of arrow 15, and at an ambient temperature of 20° C., in order to achieve a thermal performance of approximately 0.6° centigrade per watt junction to air, the dimensions of heat sinks 10 in FIG. 1 would be approximately as follows:

Heat pipe 12—7.5 inches in length by 0.625 inch in diameter

Fins 14—15 per inch, each fin being 1.5 inches square.

Heat collector 16—0.80 inch square at the surface of the interface by 1.3 inches deep.

Heat spreader 40—0.80 inch square × 0.09 inch deep.

Figure 3:
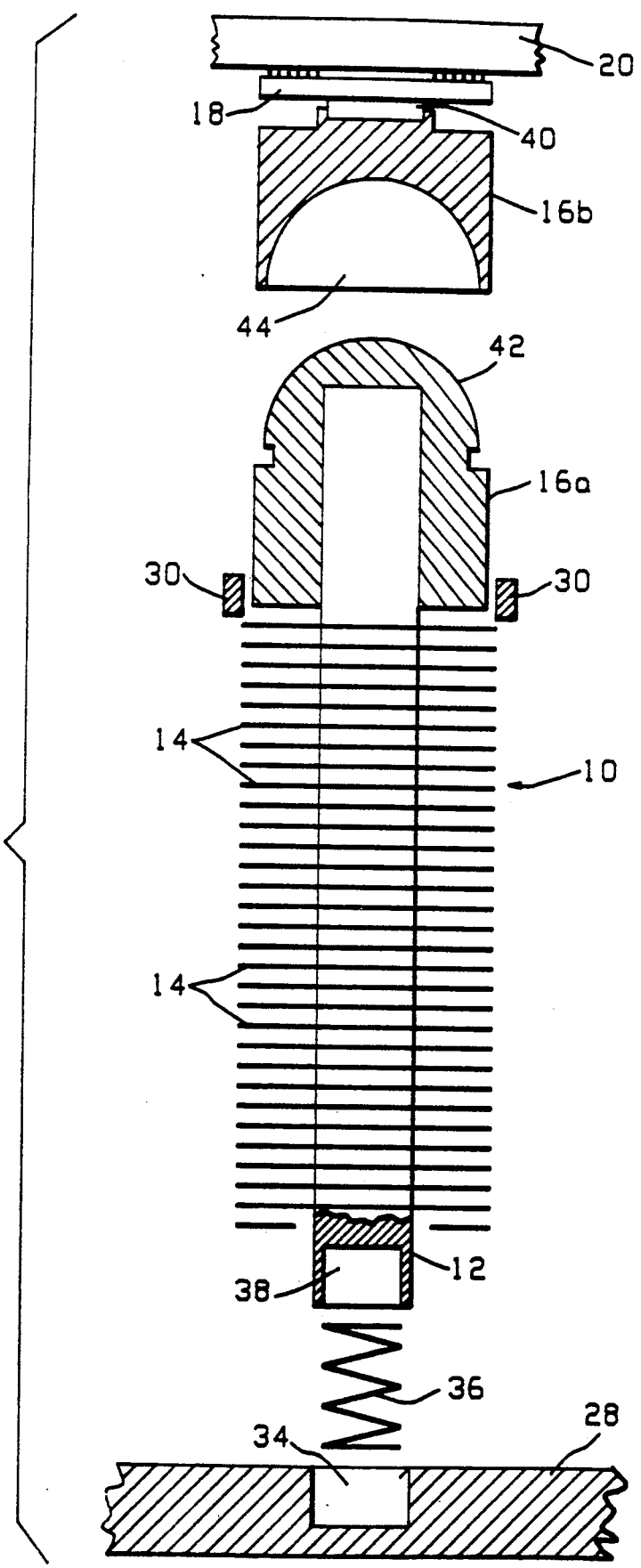
FIG. 3 is a view similar to FIG. 2 and is a variation of the heat sink assembly showing a two-section positioning heat collector.

FIG. 3 is a view similar to FIG. 2 and is a variation of the heat sink assembly, wherein the heat collector 16 consists of two sections. The first section, heat collector 16a, is mounted on the end of heat pipe 12 in a manner which will assure good thermal conductivity such as by soldering, and has a hemispherical end 42. The second section, heat collector 16b, is soldered to heat spreader 40 and has a mating hemispherical socket 44 made for secure mating contact with end 42.

Figure 4:
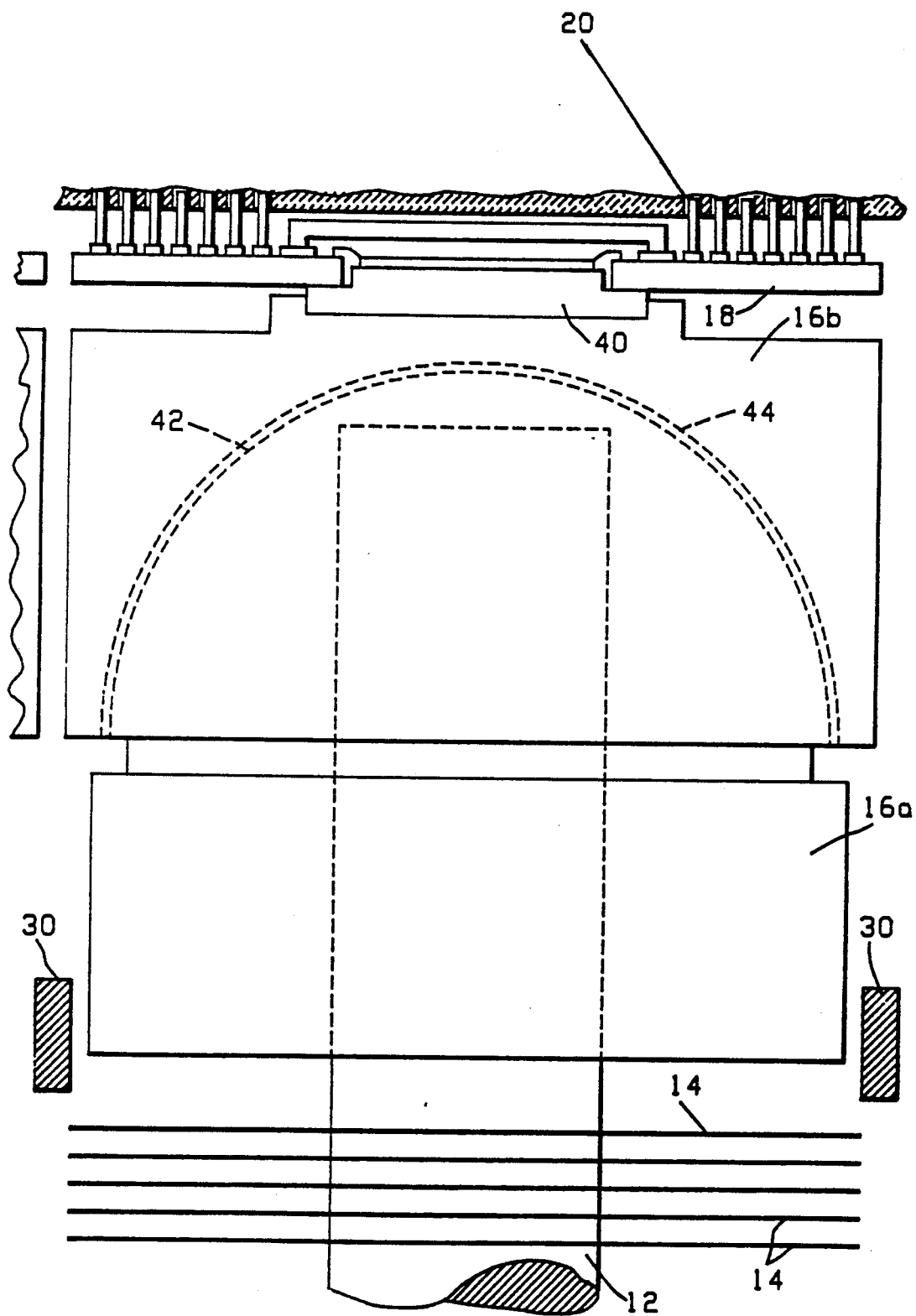
FIG. 4 is an enlarged view of the two-section heat collector shown in FIG. 3 in mating relationship.

An enlarged view of the two-section heat collector of FIG. 3 is shown in FIG. 4. End 42 and socket 44 are machined to tolerances of approximately 0.001 to 0.002 inch for close fit. The hemispherical interface is improved thermally by adding thermal grease or oil. This design is beneficial for two reasons. First, the hemispherical shape provides a larger surface area for the interface thereby increasing thermal efficiency. Second, the hemispherical socket acts as a self-alignment mechanism to automatically adjust heat sink 10 for planarity and tilt location along the X and Y axis in a plane parallel to the plane of the integrated circuit package. Stability in the direction of the longitudinal axis of heat sink 10 is provided by spring 36. The hemispherical interface allows the opposite spring loaded end of the heat pipe 12 to be constrained in two axes by the diameter of the heat pipe 12 being allowed to have a slip fit in the recess 34 which has a diameter only several thousandths of an inch larger than the heat pipe diameter. This results in the weight of the heat pipe being supported in a manner that reduces the amount of force transmitted to the electronic component during handling of the completed assembly. While other configurations can be utilized, hemispherical is the most advantageous to maximize the surface area for heat transfer, and to optimize positioning while maintaining close contact over the surface.

Figure 5:
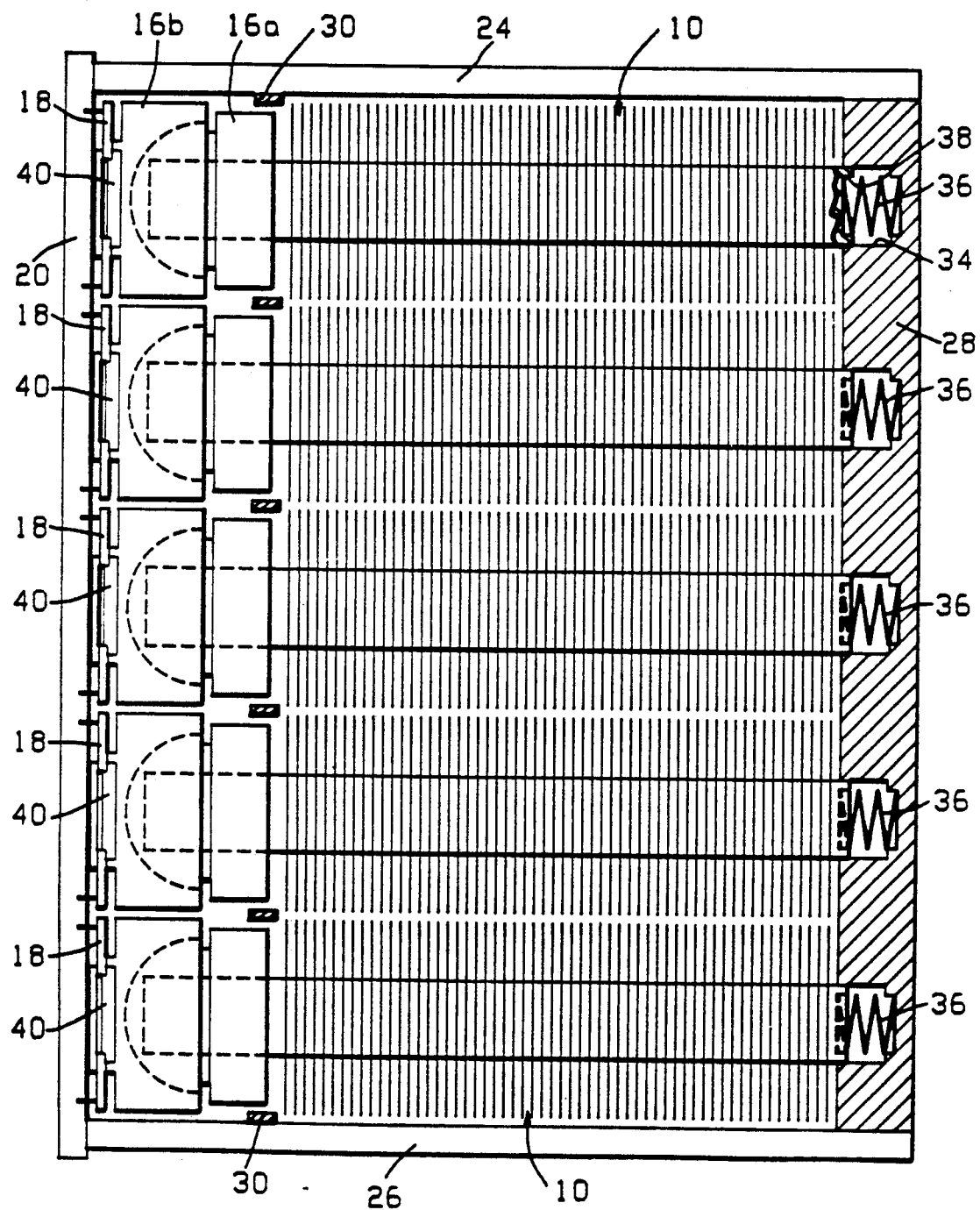
FIG. 5 is a side view, partly in section, of the cooling system shown in FIG. 1 with all of the heat pipes in place.

FIG. 5 is a side view, partly in section, of the cooling assembly shown in FIG. 1, both with the two-section heat collector of FIGS. 3 and 4. FIG. 5 illustrates how heat collector 16a of each heat sink 10 is automatically urged into proper contact and alignment with heat collector 16b by associated spring 36.

Figure 6:
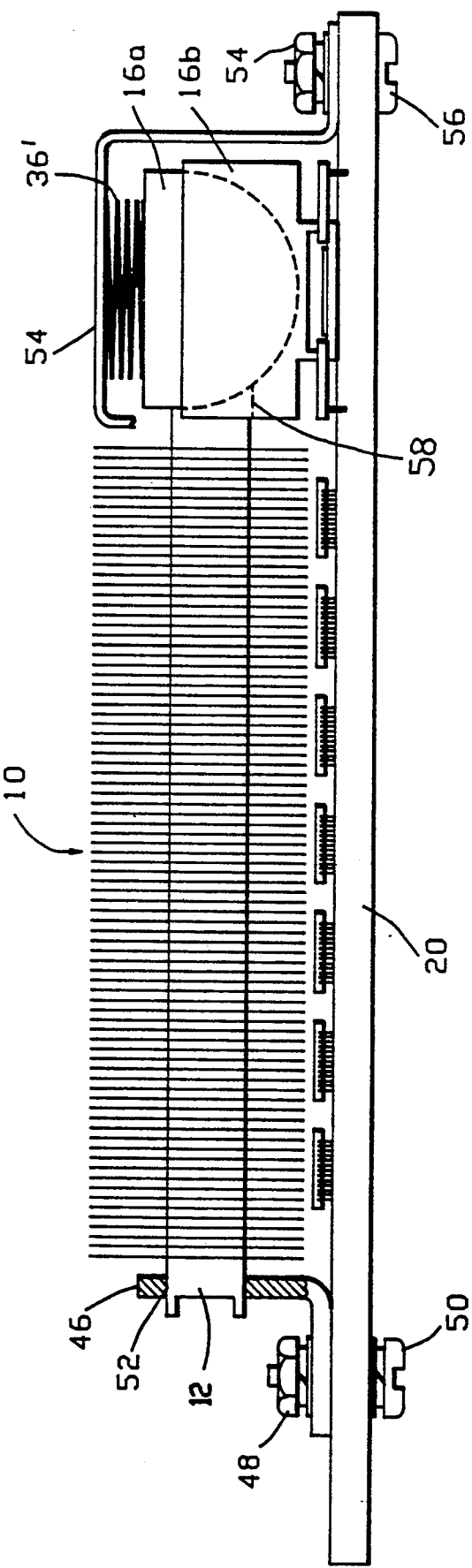
FIG. 6 is a side view of a variation of the invention showing a heat pipe mounted parallel to the electronic circuit being cooled.

FIG. 6 is a side view of another variation of the cooling system with a two-section heat collector, and shows the mounting of a single heat sink 10 parallel with the plane of printed circuit board 20. In this variation the heat sink 10 is mounted at one end to printed circuit board 20 by bracket 46. Bracket 46 is attached to the printed circuit board 20 by a nut 48 and bolt 50. The bracket 46 has an opening 52 just large enough to accommodate heat pipe 12. The other end of heat pipe 12 is connected to the side of heat collector 16a. Heat collector 16a is spring loaded into contact with mating heat collector 16b by biasing spring 36'. Spring 36' is held in position by a second bracket 54 which is connected to the printed circuit board 20 by a nut 54 and bolt 56. In this embodiment heat collector 16b has a lateral opening 58 to accommodate heat pipe 12. Lateral opening 58 is slightly larger than the outside diameter of heat pipe 12 to allow for variations in fit and alignment.

While the present invention has been described with reference to particular illustrative embodiments, it is not to be restricted by those embodiments but only by the appended claims. It is to be appreciated that those skilled in the art can change and modify the embodiments without departing from the scope and spirit of the present invention.

What is claimed is:

1. A cooling system for cooling electronic components comprising:
    at least one heat sink means for contacting an associated electronic component in order to thermally conduct heat away from the associated electronic component, wherein said heat sink means includes a heat pipe having a plurality of parallel mounted fins which are mounted perpendicular to the longitudinal axis of said heat pipe;
    a housing, wherein said housing supports said heat sink means in proper relationship with the associated electronic component, and said housing is adapted to receive air flow to pass over said heat sink means for removing heat therefrom;
    biasing means for urging said heat sink means into good thermal contact with the associated electronic component, wherein said biasing means is interposed between said heat sink means and said housing; and
    a support grid, wherein said support grid supports said heat sink means in proper relation to said housing, and is spaced apart from said housing.

2. The cooling system of claim 1 wherein said housing means includes:
    a first support member;
    a second support member parallel to and spaced apart from said first support member; and
    an end panel mounted between said first and second support members.

3. The cooling system of claim 1 wherein said biasing means includes a spring.

4. A cooling system for cooling electronic components comprising:
    heat pipe means for thermally conducting heat away from an associated electronic component, said heat pipe means having a plurality of parallel mounted fins which are mounted perpendicular to the longitudinal axis of said heat pipe means;
    positioning means for assuring proper alignment and thermal efficiency at the thermal interface between said heat pipe means and the associated electronic component, wherein said positioning means provides support for said heat pipe means; and
    biasing means for urging said heat pipe means into good thermal contact with the associated electronic component, wherein said biasing means is interposed between said heat pipe means and said positioning means.

5. The cooling system of claim 4 wherein said positioning means includes;

a first heat collector mounted on said heat pipe means, said first heat collector having an end with a predetermined shape; and a second heat collector mounted in good thermal contact with the associated electronic component, said second heat collector having a socket shaped to accommodate in mating relationship said predetermined shape of the end of said first heat collector.

6. The cooling system of claim 5 wherein said predetermined shape of the end of said first heat collector is hemispherical.

7. The cooling system of claim 4 further including a plurality of said heat pipe means, each associated with a different one of the electronic components.

8. A cooling system for cooling electronic components on a printed circuit board comprising:

at least one heat pipe for thermally conducting heat away from an associated electronic component, wherein said heat pipe has a plurality of parallel mounted fins which are mounted perpendicular to the longitudinal axis of said heat pipe;

a housing, wherein said housing supports said heat pipe in proper relationship with the associated electronic component;

a first heat collector mounted on said heat pipe, said first heat collector having an end with a predetermined shape;

a second heat collector mounted in good thermal contact with the associated electronic component, said second heat collector having a socket shaped to accommodate in mating relationship said predetermined shape of the end of said first heat collector; and a biasing member for urging said heat pipe into good thermal contact with the associated electronic component, wherein said biasing member is interposed between said heat pipe and said housing.

9. The cooling system of claim 8 wherein said biasing means includes a spring.

10. The cooling system of claim 9 wherein said housing means includes:
 a first support member;
 a second support member parallel to and spaced apart from said first support member and;
 an end panel mounted between said first and second support members.

11. The cooling system of claim 8 wherein said predetermined shape of the end of said first heat collector is hemispherical.

12. A cooling system for cooling electronic components comprising:

a housing shaped to permit air flow;

at least one heat pipe slidably mounted in said housing in cooperative relationship with an electronic component to be cooled, wherein said heat pipe has a plurality of parallel mounted fins which are mounted perpendicular to the longitudinal axis of said heat pipe;

a first heat collector mounted on said heat pipe, said first heat collector having an end with a predetermined shape;

a second heat collector mounted in good thermal contact with the associated electronic component, said second heat collector having a socket shaped to accommodate in mating relationship said predetermined shape of said end of said first heat collector; and a biasing member mounted on said housing and operable with said heat pipe, whereby said biasing member urges said heat pipe such that good thermal contact is made between said first heat collector and said second heat collector mounted on the associated electronic component.

13. The cooling system of claim 12 wherein said predetermined shape of said end of said first heat collector is hemispherical.

14. The cooling system of claim 13 wherein said biasing device includes a spring.

* * * * *